United States Patent
Tsukamoto

(10) Patent No.: US 8,119,192 B2
(45) Date of Patent: Feb. 21, 2012

(54) METHOD OF MANUFACTURING PIEZOELECTRIC ELEMENT AND METHOD OF MANUFACTURING LIQUID EJECTION HEAD

(75) Inventor: Ryuji Tsukamoto, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 806 days.

(21) Appl. No.: 12/057,150

(22) Filed: Mar. 27, 2008

(65) Prior Publication Data
US 2008/0241362 A1 Oct. 2, 2008

(30) Foreign Application Priority Data
Mar. 30, 2007 (JP) ................. 2007-095513

(51) Int. Cl.
*B41J 2/16* (2006.01)
*B41J 2/04* (2006.01)
(52) U.S. Cl. ............ 427/100; 427/58; 427/466; 347/54; 347/68; 347/70; 347/71; 347/72; 174/68.1; 174/259
(58) Field of Classification Search .................. 427/100; 347/70, 71
See application file for complete search history.

(56) References Cited

U.S. PATENT DOCUMENTS

| | | | | |
|---|---|---|---|---|
| 3,985,914 | A * | 10/1976 | Sasaki et al. | 427/457 |
| 5,305,507 | A * | 4/1994 | Dvorsky et al. | 29/25.35 |
| 6,051,915 | A * | 4/2000 | Katsuno et al. | 310/359 |
| 6,347,862 | B1 | 2/2002 | Kanno et al. | |
| 2001/0005213 | A1 * | 6/2001 | Ikeda et al. | 347/70 |
| 2006/0092239 | A1 * | 5/2006 | Sung et al. | 347/71 |
| 2007/0069263 | A1 * | 3/2007 | Mizuuchi et al. | 257/295 |
| 2007/0195134 | A1 * | 8/2007 | Lee et al. | 347/72 |
| 2008/0218559 | A1 * | 9/2008 | Fujii et al. | 347/68 |

FOREIGN PATENT DOCUMENTS
JP 10-286953 A 10/1998
WO WO 2004107466 A1 * 12/2004

OTHER PUBLICATIONS
Moseley et al., Sensor Materials, CRC Press, (1996), p. 119.*

* cited by examiner

*Primary Examiner* — Michael Cleveland
*Assistant Examiner* — Lisha Jiang
(74) *Attorney, Agent, or Firm* — Birch, Stewart, Kolasch & Birch, LLP

(57) ABSTRACT

The method of manufacturing a piezoelectric element includes: a lower electrode forming step of forming a lower electrode on a surface of a substrate; a piezoelectric film deposition step of depositing a piezoelectric film made of a piezoelectric material by one of epitaxial growth and oriented growth onto a surface of the lower electrode reverse to a surface adjacent to the substrate; an upper electrode forming step of forming an upper electrode onto a surface of the piezoelectric film reverse to a surface adjacent to the lower electrode; and a polarization direction reversal step of reversing a polarization direction of the piezoelectric film by maintaining, after the upper electrode forming step, a state for a prescribed duration where a temperature of the piezoelectric film is set to a first temperature while application of an electric field to the piezoelectric film in a direction from the upper electrode toward the lower electrode is performed, then keeping the application of the electric field while lowering the temperature of the piezoelectric film to a second temperature lower than the first temperature, and then stopping the application of the electric field.

9 Claims, 12 Drawing Sheets

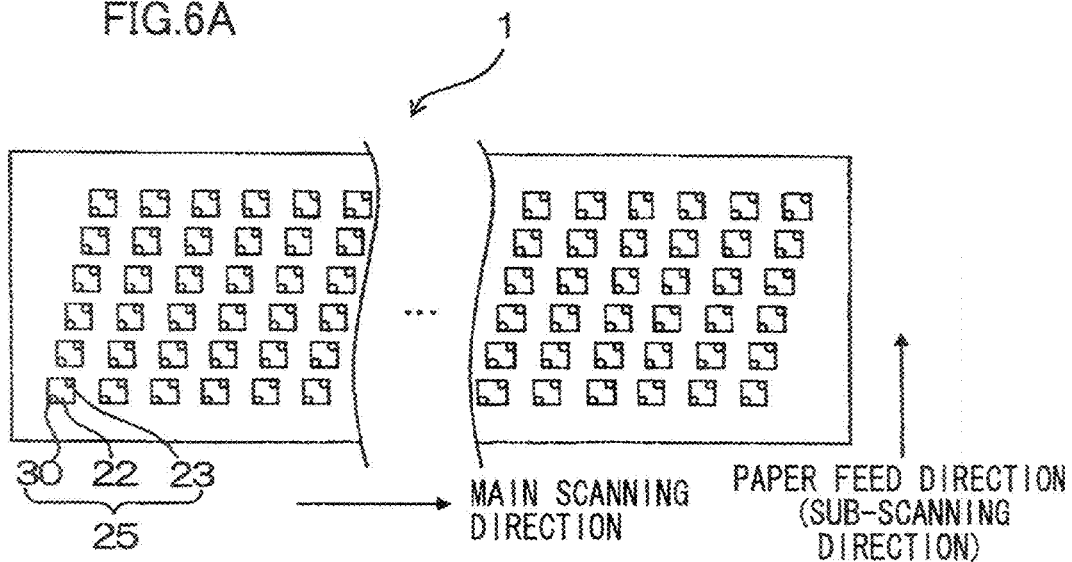
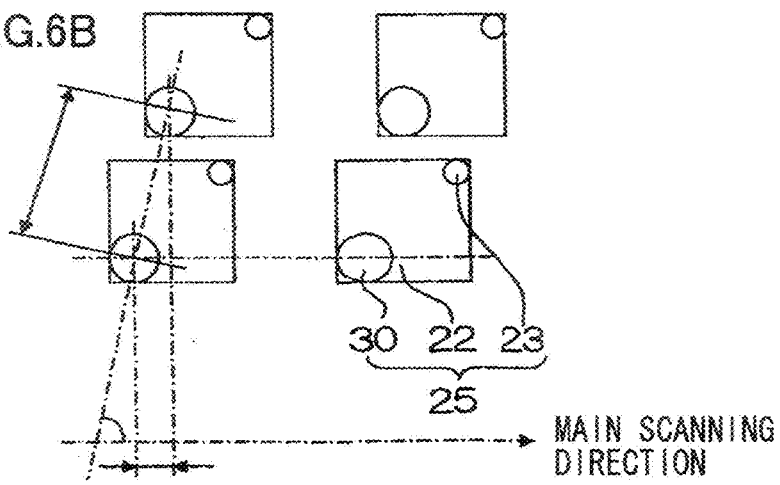
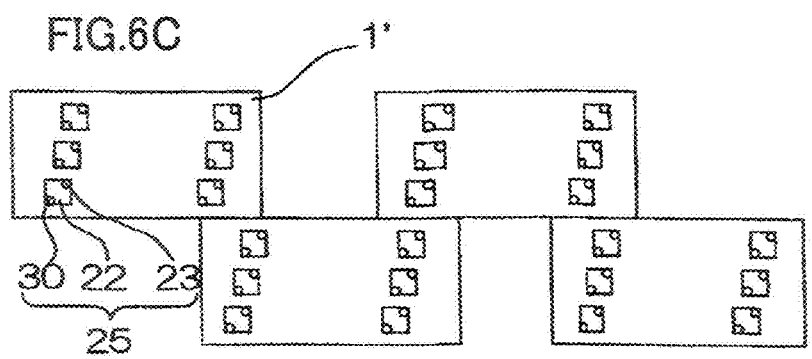

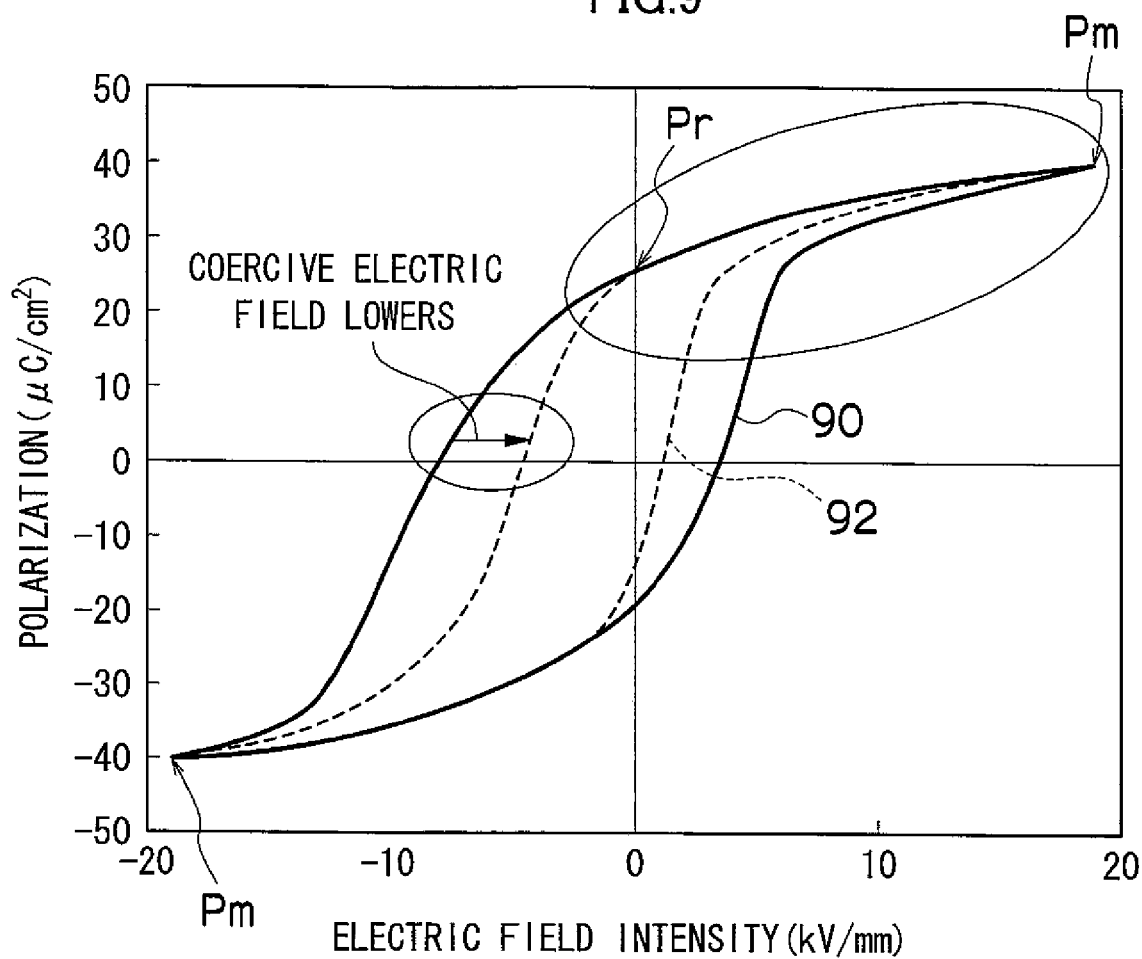

FIG.13
RELATED ART

| ISSUE | SOLUTION | PROBLEM |
|---|---|---|
| DIRECTION OF ORIENTATION IS OPPOSITE | TRANSFER PREVIOUSLY MANUFACTURED PIEZOELECTRIC ELEMENT TO PRESSURE CHAMBER | POSITIONING DIFFICULTIES |
| | USE LOWER ELECTRODE AS ADDRESS ELECTRODE | LEAKAGE CURRENT |
| | DRIVE WITH NEGATIVE VOLTAGE | HIGH COSTS |

METHOD OF MANUFACTURING PIEZOELECTRIC ELEMENT AND METHOD OF MANUFACTURING LIQUID EJECTION HEAD

BACKGROUND OF THE INVENTION

1. Field of the Invention

The present invention relates to a method of manufacturing a piezoelectric element and a method of manufacturing a liquid ejection head, and more particularly, to technology for manufacturing an oriented piezoelectric element deposited by means of a sputtering method, or the like.

2. Description of the Related Art

In general, an inkjet recording apparatus, which forms a desired image by ejecting ink droplets onto a recording medium from an inkjet head, is used widely as a generic image forming apparatus. In the inkjet recording apparatus, piezoelectric elements (piezoelectric actuators) are suitable for use as pressure application devices for causing ink droplets to be ejected from the inkjet head.

Improvements in the printing characteristics, and in particular, the increase in the resolution and the increase in the printing speed are demanded in inkjet heads. For this purpose, it has been sought to increase the resolution and raise the printing speed by using a multiple-nozzle head structure in which nozzles are formed very finely and are also arranged at high density. In order to achieve a high-density arrangement of nozzles, compactification of the piezoelectric elements is highly necessary.

In order to make the piezoelectric elements more compact in size, it is valuable to reduce the thickness of the piezoelectric elements. For example, Japanese Patent Application Publication No. 10-286953 discloses technology in which, a lead dielectric layer (piezoelectric film) having a thickness of 3 μm is formed in order to achieve thin film thickness in the piezoelectric elements.

In the piezoelectric elements used in an inkjet head, if upper electrodes are used as address electrodes (individual electrodes), lower electrodes are used as ground electrodes (a common electrode), and the lower electrodes are grounded while the upper electrodes are applied with a positive voltage to drive the piezoelectric elements, then it is beneficial in terms of the cost of the devices, such as the ease of wiring, switching ICs (integrated circuits), and the like, and hence this wiring structure is appropriate. Hence, in general, the piezoelectric elements are subjected to polarization processing in such a manner that the piezoelectric elements deform in a direction that causes the liquid to be ejected when the lower electrodes are grounded while the upper electrodes are applied with a positive voltage.

Nevertheless, in Japanese Patent Application Publication No. 10-286953, a piezoelectric film is deposited on the lower electrode by sputtering, and therefore the polarization direction of the piezoelectric film is the direction from the lower electrode toward the upper electrode. More specifically, if a piezoelectric element 102 shown in FIG. 10 is produced by sputtering to deposit a piezoelectric film 112 on a lower electrode 110, then the polarization direction upon the deposition of the piezoelectric film 112 is the direction from the lower electrode 110 toward an upper electrode 114 (the upward direction indicated with an arrow A in FIG. 10). Then, in order to drive the piezoelectric element 102 having this composition to deform in the direction to apply pressure through a diaphragm 104 to liquid in a pressure chamber 106 to eject the liquid from a nozzle 108 (to deform in the direction indicated with an arrow B in FIG. 10), it is necessary to apply an electric field to the piezoelectric film 112 in the same direction as the polarization direction of the piezoelectric film 112. It is possible to adopt a method for this electric field application in which the upper electrode 114 is set to ground while a positive voltage is applied to the lower electrode 110 from a drive source 115. However, if the upper electrode 114 is used as the ground electrode and the lower electrode 110 is used as the address electrode, then the wiring structure becomes complicated, and hence this method is not desirable from a structural and a manufacturing point of view.

In a general piezoelectric element, whether an electric field (voltage) is applied from the upper electrode toward the lower electrode, or whether an electric field is applied from the lower electrode toward the upper electrode, regardless of the direction of the applied electric field, it is possible to obtain the same amount of displacement provided that the electric field of the same intensity (voltage) is applied. On the other hand, in a piezoelectric element composed of a piezoelectric film formed by sputtering, the piezoelectric film innately exhibits an orientation (i.e., polarization direction) that is set when the piezoelectric film is deposited, and there is a phenomenon of variation in the amount of displacement of the piezoelectric element depending on the direction of the electric field applied to the piezoelectric film.

As shown in FIG. 11, when the electric field of intensity in the range of 0 kV/mm to −6.0 kV/mm is applied to the piezoelectric film in the piezoelectric element 102, then there is a direct proportional relationship between the applied electric field intensity and the amount of displacement (nanometers) of the piezoelectric element 102 (the characteristics represented with a line 120); however, when the applied electric field intensity is in the range of 0 kV/mm to 6.0 kV/mm, then not only is this direct proportional relationship lost, but also a phenomenon of reversal of the direction of displacement appears (the characteristics represented with a line 122).

As a method for avoiding these problems, there is a method of manufacturing an inkjet head by fabricating a piezoelectric element structure by sequentially depositing an upper electrode (114 in FIG. 10), a piezoelectric film (112 in FIG. 10) and a lower electrode (110 in FIG. 10) by sputtering onto a monocrystalline substrate of silicon (Si), magnesium oxide (MgO), or the like, (a so-called "dummy substrate"), and further forming a thin film serving as a diaphragm (104 in FIG. 10) onto the lower electrode, whereupon the thus fabricated piezoelectric element structure is mechanically inverted and transferred (bonded) to a pressure chamber structure formed in a silicon substrate or a glass substrate (corresponding to the base plate having the pressure chamber 106 formed therein in FIG. 10).

Further alternative methods of avoiding the aforementioned problems include a method where the upper electrode is used as the ground electrode and the lower electrode is used as the address electrode to be applied with a positive voltage, and a method where the lower electrode is used as the ground electrode and the upper electrode is used as the address electrode to be applied with a negative voltage to apply an electric field to the piezoelectric film in the negative direction (an electric field in the direction indicated with an arrow C in FIG. 10).

However, in the method where the previously fabricated piezoelectric element structure is mechanically inverted and transferred to the pressure chamber structure, costs are high since the monocrystalline substrate is thrown away after use. Furthermore, since the transfer bonding method is used, it is necessary to register the piezoelectric element structure and the pressure chamber structure accurately in position, but it is in fact extremely difficult to achieve accurate positioning between the piezoelectric element structure and the pressure chamber structure. The positioning accuracy of the piezoelectric element structure and the pressure chamber structure affects the ejection characteristics, and in an inkjet head having a plurality of nozzles, it is extremely difficult to fabricate the head having uniform ejection characteristics in the plurality of nozzles.

In the method of using the lower electrode 110 as the address electrode, then as shown in FIG. 12, if the diaphragm is made of silicon, a leakage current 130 arises and electrical cross-talk occurs whereby displacement is produced even in the piezoelectric elements that are not intended to be applied with the drive signal, and consequently there is a problem in that ink droplets are ejected from the nozzles that are not intended to be driven.

In the method of using the upper electrode 114 as the address electrode and applying the negative voltage to the upper electrode 114 to apply the electric field in the negative direction, the costs relating to the drive IC and the power source device required to apply the negative voltage are higher (several times to several tens of times higher) than those required for the positive-voltage.

To summarize the above-described problems relating to the oriented piezoelectric film (namely, the piezoelectric film deposited by sputtering), the method that mechanically inverts the piezoelectric element structure and bonds same to the pressure chamber structure involves the problem of positioning accuracy during bonding, and the method that uses the lower electrode 110 as the address electrode involves the problem of electrical cross-talk occurring as a result of leakage current. Furthermore, the method that uses the electric field in the negative direction as the applied electric field involves the problem of increased costs in relation to the IC, and so on (see FIG. 13).

SUMMARY OF THE INVENTION

The present invention has been contrived in view of these circumstances, an object thereof being to provide a method of manufacturing a piezoelectric element and a method of manufacturing a liquid ejection head, whereby desirable piezoelectric elements are manufactured by an epitaxial growth method or an oriented growth method, such as sputtering.

In order to attain the aforementioned object, the present invention is directed to a method of manufacturing a piezoelectric element, comprising: a lower electrode forming step of forming a lower electrode on a surface of a substrate; a piezoelectric film deposition step of depositing a piezoelectric film made of a piezoelectric material by one of epitaxial growth and oriented growth onto a surface of the lower electrode reverse to a surface adjacent to the substrate; an upper electrode forming step of forming an upper electrode onto a surface of the piezoelectric film reverse to a surface adjacent to the lower electrode; and a polarization direction reversal step of reversing a polarization direction of the piezoelectric film by maintaining, after the upper electrode forming step, a state for a prescribed duration where a temperature of the piezoelectric film is set to a first temperature while application of an electric field to the piezoelectric film in a direction from the upper electrode toward the lower electrode is performed, then keeping the application of the electric field while lowering the temperature of the piezoelectric film to a second temperature lower than the first temperature, and then stopping the application of the electric field.

In the piezoelectric film that is deposited by epitaxial growth or oriented growth, the polarization direction of the piezoelectric film upon the deposition is the direction of growth (direction of orientation), and when the piezoelectric film is grown from the lower electrode, then the polarization direction is the direction from the lower electrode toward the upper electrode. According to this aspect of the present invention, this polarization direction is reversed to the direction from the upper electrode toward the lower electrode, and the piezoelectric body is enabled to be operated by applying an electric field in the direction from the upper electrode toward the lower electrode. Thus, it is possible to control the amount of displacement and the direction of displacement of the piezoelectric body by using the lower electrode as a ground electrode and taking the upper electrode as an address electrode and applying a positive voltage to the upper electrode.

It is preferable that the method includes a patterning step of patterning the upper electrode, the piezoelectric film and the lower electrode to prescribed shapes, and it is more preferable that the upper electrode and the piezoelectric film are patterned together in a common patterning step.

If a plurality of piezoelectric films (piezoelectric elements) are formed on the same substrate, then it is preferable that the lower electrodes formed on the substrate are used as the ground electrodes (i.e., a common electrode), the upper electrodes on the exposed side are taken as address electrodes (individual electrodes), and a positive voltage is applied to the upper electrodes.

It is preferable that the method includes a step of bonding a wiring member having wiring pattern to be connected to an external device.

It is possible to call the composition including the upper electrode, the piezoelectric film and the lower electrode as a piezoelectric element. Moreover, a structure which deforms another member bonded to the piezoelectric element by operating the piezoelectric element can be called a piezoelectric actuator. One example of the member included in the piezoelectric actuator is the substrate (diaphragm).

Preferably, the first temperature is not lower than 100° C. and lower than a Curie point of the piezoelectric material; the prescribed duration is not shorter than one minute; and the second temperature is not lower than 10° C. and not higher than 70° C.

According to this aspect of the present invention, by setting the first temperature to 100° C. or above, the stress from the substrate is alleviated due to the heating of the substrate, and a state more liable to the reversal of polarization direction is achieved, and by setting the second temperature to 70° C. or lower, the polarization direction is constrained, once it has been reversed. Furthermore, by setting the first temperature to the temperature lower than the Curie point of the piezoelectric material of the piezoelectric film, it is possible to prevent dielectric breakdown in the piezoelectric film. If the second temperature is lower than 10° C., then it becomes difficult to control the environmental temperature, and therefore it is preferable that the second temperature is set to 10° C. or higher.

Preferably, the method further comprises: a processing step of, after the polarization direction reversal step, processing the piezoelectric film at a third temperature not lower than 130° C. and lower than the Curie point; and a repolarization step of, after the processing step, carrying out repolarization processing of applying an electric field to the piezoelectric film in the direction from the upper electrode toward the lower electrode at normal temperature.

After the polarization direction has been reversed, if subsequent processing is carried out under temperature conditions equal to or higher than 150° C. and lower than the Curie point, then the polarization direction of the piezoelectric film is reversed again and therefore returns to the polarization direction upon the deposition of the piezoelectric film, and consequently the prescribed characteristics cannot be obtained in the piezoelectric element. According to this aspect of the present invention, it is possible to restore the piezoelectric element to have the intended characteristics by carrying out repolarization processing at normal temperature, after the subsequent processing.

Here, "normal temperature" does not only mean 25° C., as generally implied, but rather includes the temperature range of the storage environment in which the piezoelectric element manufactured according to the present invention, or a structure installed with the piezoelectric element, is stored. One example of the storage temperature range is from 10° C. (for example, a cool dark place) to 50° C. (for example, the maximum air temperature in a hot geographical region).

Furthermore, the subsequent processing referred to here may include a plurality of processing steps.

Preferably, the electric field applied in the polarization direction reversal step has an intensity not lower than 5.0 kV/mm.

According to this aspect of the present invention, a desirable piezoelectric element that maintains the characteristics before the reversal of polarization direction is manufactured. The applied electric field in the polarization direction reversal processing step has an intensity lower than the withstanding intensity of the piezoelectric element (piezoelectric film).

Preferably, the piezoelectric film deposition step is performed with at least one of sputtering, chemical vapor deposition, and sol gelation.

According to this aspect of the present invention, by using sputtering, CVD or sol gelation, it is possible to deposit a desirable piezoelectric film that is formed to a very small thickness.

In order to attain the aforementioned object, the present invention is also directed to a method of manufacturing a liquid ejection head including an ejection port from which liquid is ejected, an ejection side flow channel which is connected to the ejection port, a pressure chamber which is connected to the ejection side flow channel and accommodates the liquid to be ejected from the ejection port, and a piezoelectric element which pressurizes the liquid accommodated in the pressure chamber, the method comprising: a piezoelectric element manufacturing step of manufacturing the piezoelectric element by the above-described method; a pressure chamber forming step of forming the pressure chamber on a surface of the substrate reverse to the surface on which the lower electrode is formed; a flow channel plate bonding step of bonding a flow channel plate formed with the ejection side flow channel to the substrate in which the pressure chamber is formed, after registering the ejection side flow channel and the pressure chamber mutually in position; and an ejection port plate bonding step of bonding an ejection port plate formed with the ejection port to the flow channel plate, after registering the ejection port and the ejection side flow channel mutually in position.

According to this aspect of the present invention, a desirable liquid ejection head is manufactured, which can eject liquid from the ejection port by using the upper electrode as an address electrode, taking the lower electrode as a ground electrode, and applying a positive voltage to the upper electrode (namely, applying an electric field to the piezoelectric element in the same direction as the polarization direction of the piezoelectric element).

In a piezoelectric film that is deposited by epitaxial growth or oriented growth, the polarization direction of the film upon the deposition is the direction of growth (direction of orientation), and when the piezoelectric film is grown from the lower electrode, then the polarization direction is the direction from the lower electrode toward the upper electrode; therefore, according to the present invention, this polarization direction is reversed to the direction from the upper electrode toward the lower electrode, and the piezoelectric body is operated by applying an electric field in the direction from the upper electrode toward the lower electrode, then it is possible to control the amount of displacement and the direction of displacement of the piezoelectric body.

Furthermore, a desirable liquid ejection head is manufactured, which is capable of ejecting liquid from the ejection port, by operating the piezoelectric element by using the upper electrode as an address electrode, taking the lower electrode as a ground electrode and applying a positive voltage to the upper electrode.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 6A to 6C are plan view perspective diagrams showing embodiments of liquid ejection heads manufactured by the process shown in FIGS. 1A to 1H;

FIG. 9 is a diagram showing the characteristics of a piezoelectric element manufactured by a method of manufacturing a liquid ejection head (method of manufacturing the piezoelectric element) according to a third embodiment of the present invention;

FIG. 13 is a diagram for describing problems associated with the related art.

DETAILED DESCRIPTION OF THE PREFERRED EMBODIMENTS

Description of Method of Manufacturing Liquid Ejection Head

A method of manufacturing a piezoelectric element and a method of manufacturing a liquid ejection head according to an embodiment of the present invention are described with reference to FIGS. 1A to 1H.

(1) Lower Electrode Forming Step

Figure 1A:
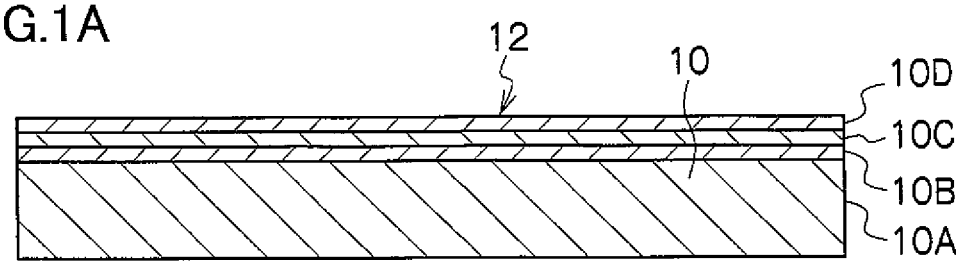
FIGS. 1A to 1H are diagrams showing steps of a method of manufacturing a liquid ejection head (method of manufacturing a piezoelectric element) according to an embodiment of the present invention.

As shown in FIG. 1A, a surface-insulated SOI (silicon on insulator) substrate (hereinafter referred to as the "substrate") 10, which is a silicon substrate provided with $SiO_2$ insulating films, is prepared. The substrate 10 shown in FIG. 1A has a structure in which a silicon base 10A, an insulating layer 10B of a silicon oxide film, a silicon base 10C, and an insulating layer 10D of a silicon oxide film, are layered together in sequence.

Figure 1B:
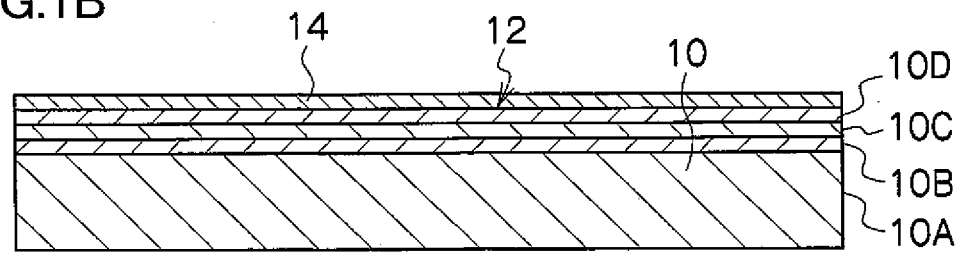

Then, a lower electrode 14 is deposited on the upper surface 12 of the substrate 10 (the surface where the insulating layer 10D is formed), by sputtering, vapor deposition, or the like, as shown in FIG. 1B. For the lower electrode 14, it is desirable to use iridium (Ir), platinum (Pt), titanium (Ti), or the like.

(2) Piezoelectric Film Depositing Step

Figure 1C:
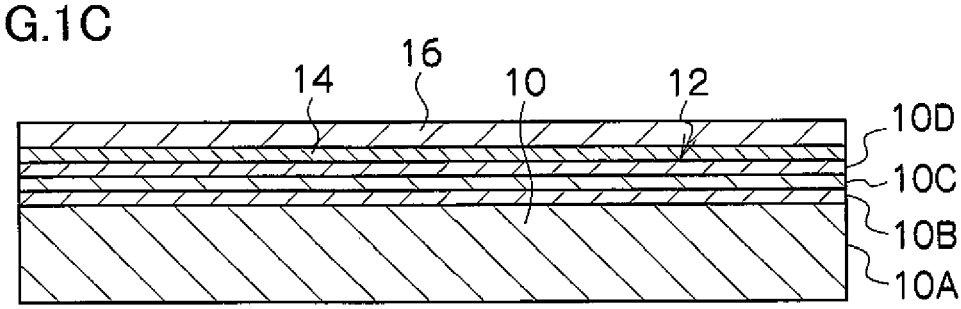

When the lower electrode 14 has been deposited, a piezoelectric film 16 having a prescribed orientation is deposited on the upper surface of the lower electrode 14 (the surface of the lower electrode 14 on the side reverse to the side adjacent to the insulating layer 10D), by means of an epitaxial growth method, such as sputtering, CVD (chemical vapor deposition), sol gelation, or the like, as shown in FIG. 1C. It is desirable to use PZT (lead zirconate titanate, $Pb(Zr, Ti)O_3$) for the piezoelectric film 16.

(3) Upper Electrode Depositing Step

Figure 1D:
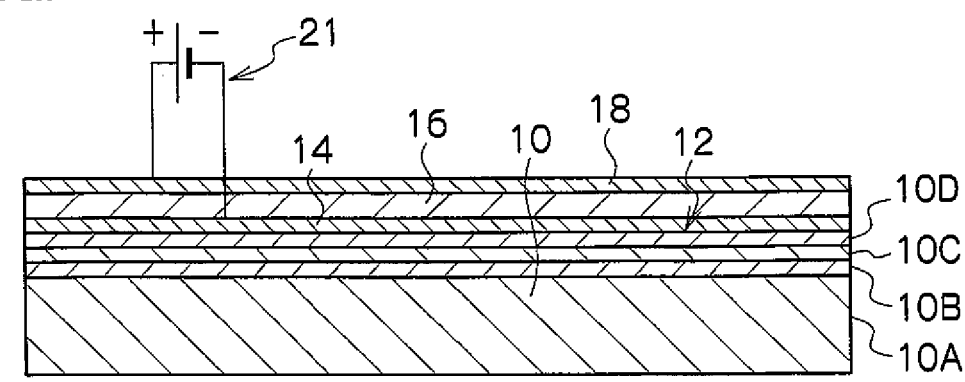

When the piezoelectric film 16 has been deposited, an upper electrode 18 is deposited by sputtering, or the like, on the upper surface of the piezoelectric film 16 (the surface of the piezoelectric film 16 on the side reverse to the side adjacent to the lower electrode 14) as shown in FIG. 1D. For the upper electrode 18, it is desirable to use iridium (Ir), platinum (Pt), titanium (Ti), gold (Au), tungsten (w), or the like.

In the present specification, the structure in which the piezoelectric film 16 is arranged between the lower electrode 14 and the upper electrode 18 is called a piezoelectric element 20, and a composition that causes another member to deform (vibrate) by driving the piezoelectric element 20 is called a piezoelectric actuator. One example of the piezoelectric actuator is a structure that causes the piezoelectric element 20 and a diaphragm (described in detail below).

(4) Polarization Direction Reversal Processing Step

In a state where the lower electrode 14, the piezoelectric film 16 and the upper electrode 18 have been deposited on the substrate 10 as shown in FIG. 1D, the piezoelectric film 16 has an orientation (polarization) in the direction from the lower electrode 14 toward the upper electrode 18 (the upward direction in FIG. 1D). In this polarization direction reversal processing step, processing is carried out in order to reverse the polarization direction of the piezoelectric film 16 that is naturally set when the piezoelectric film 16 is deposited.

More specifically, the ambient temperature is set to a first temperature $T_1$ that is equal to or higher than 100° C. and lower than the Curie point of the piezoelectric material of the piezoelectric film 16, the first temperature $T_1$ is maintained while an electric field of intensity $E_1$ is applied between the lower electrode 14 and the upper electrode 18 in the direction opposite to the polarization direction of the piezoelectric film 16, by an electric field generating device 21, and then the first temperature $T_1$ and the application of the electric field of the intensity $E_1$ are maintained for one minute or longer (desirably a duration not shorter than 10 minutes and shorter than 60 minutes).

After the state of maintaining the first temperature $T_1$ and the application of the electric field of the intensity $E_1$ has continued for one minute or longer, then the application of the electric field of the intensity $E_1$ is maintained while the ambient temperature is lowered to a second temperature $T_2$ (e.g., 70° C.), and when the ambient temperature reaches the second temperature $T_2$, the application of the electric field of the intensity $E_1$ is stopped. Thus, by passing through the steps of heating, applying the inverse electric field, maintaining the state of heating and application of the inverse electric field, stopping the heating, and stopping the application of the inverse electric field, the polarization direction of the piezoelectric film 16 is reversed and set to the direction from the upper electrode 18 toward the lower electrode 14 (the direction indicated with an arrow A' in FIG. 2). It is possible to set the second temperature $T_2$ to a temperature between 10° C. to 70° C.

The reasons for maintaining the first temperature $T_1$ (the reasons why it is not possible to reverse the polarization direction at room temperature) are as follows. One reason why the reversal of polarization direction does not occur at a temperature lower than 100° C. is because the polarization direction of the piezoelectric body in the vicinity of the interface with the substrate is constrained by the stress exerted by the substrate. More specifically, for example, at room temperature, a stress is generated between the piezoelectric film 16 and the substrate 10 due to linear expansion, and the polarization of the piezoelectric film 16 is constrained by this stress, and therefore reversal of the polarization direction does not occur. On the other hand, in a high-temperature environment (in the present embodiment, at the temperature not lower than 100° C. and lower than the Curie point of the piezoelectric material), the stress between the piezoelectric film 16 and the substrate 10 is alleviated, and by applying the electric field in the direction opposite to the polarization direction, to the piezoelectric film 16 under these conditions, a state is achieved where the polarization direction of the piezoelectric film 16 becomes more liable to be reversed.

If the electric field of the intensity $E_1$ is applied when the first temperature $T_1$ is set to a temperature equal to or higher than the Curie point of the piezoelectric material of the piezoelectric film 16, there is an increased possibility that the piezoelectric film 16 suffers dielectric breakdown, and hence the first temperature $T_1$ is set to the temperature lower than the Curie point of the piezoelectric material.

(5) Piezoelectric Element Patterning Step

Figure 1E:
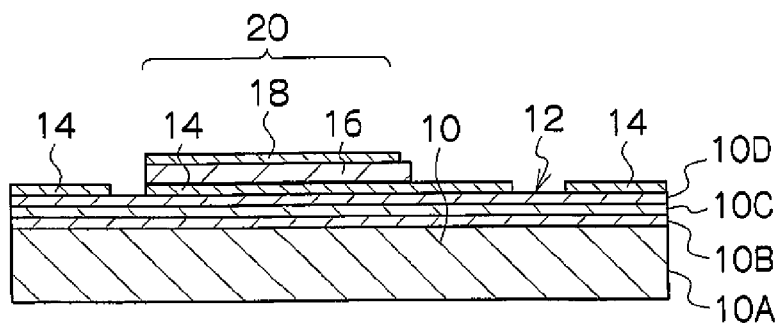

After carrying out the polarization direction reversal processing step, a step is carried out for processing the lower electrode 14, the upper electrode 18 and the piezoelectric film 16 into prescribed shapes, and the piezoelectric element 20, which has the upper electrode 18 on the upper surface of the piezoelectric film 16 and the lower electrode 14 on the lower surface of the piezoelectric film 16, is thus formed as shown in FIG. 1E.

It is desirable to use etching for the step of shaping the lower electrode 14, the upper electrode 18 and the piezoelectric film 16, and this shaping step is carried out in a high-temperature environment of approximately 150° C. The lower electrode 14, the upper electrode 18 and the piezoelectric film 16 may be shaped by separate steps (with different methods), or they may be shaped together in the same step (with the same method).

(6) Pressure Chamber Forming Step

Figure 1F:
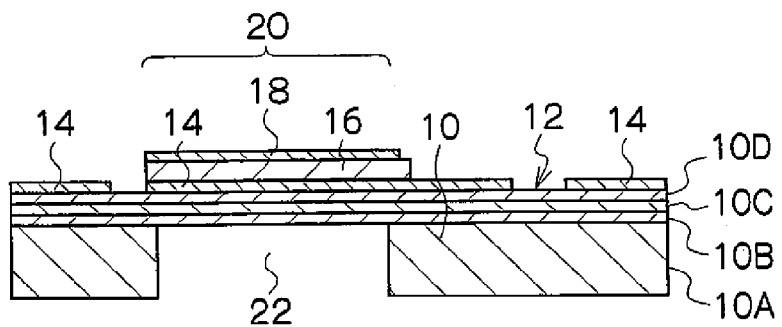

Thereupon, an opening 22 serving as the pressure chamber is formed in the silicon base 10A, by using an etching technique, or the like, as shown in FIG. 1F. Here, the insulating layer 10B, the silicon base 10C and the insulating layer 10D serve as the diaphragm.

(7) Flow Channel Plate Bonding Step, and Nozzle Plate Bonding Step

When the pressure chamber 22 has been formed on the substrate 10 (the silicon base 10A) as shown in FIG. 1F, then a flow channel plate 28 is bonded to the surface of the opening side of the pressure chamber 22 (the surface of the substrate 10 reverse to the surface where the piezoelectric element 20 is arranged). The flow channel plate 28 is formed with a recess section 24 that is to become a common liquid chamber and a supply restrictor, and an opening section 26 that is to become an ejection side flow channel connecting to the pressure chamber 22. When the substrate 10 is bonded with the flow channel plate 28, then the pressure chamber 22 is accurately registered in position with the common liquid chamber, the supply restrictor, and the ejection side flow channel.

Figure 1G:
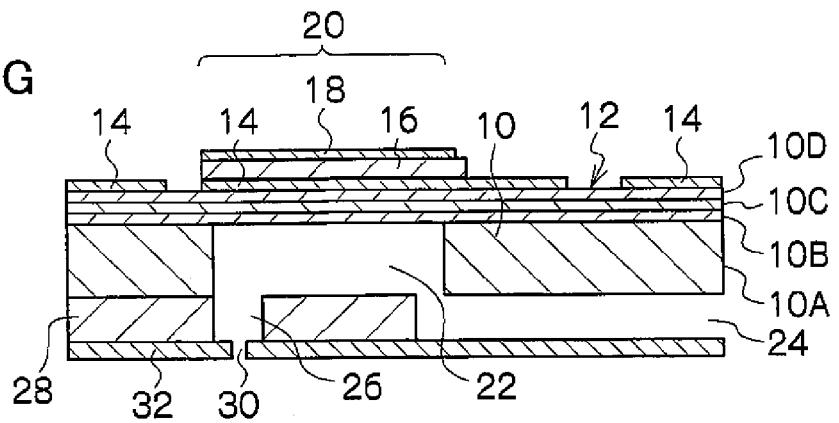

Moreover, a nozzle plate 32, which is formed with a fine hole 30 serving as the nozzle, is bonded to the flow channel plate 28 on the side reverse to the side adjacent to the substrate 10 as shown in FIG. 1G. When the nozzle plate 32 is bonded to the flow channel plate 28, the nozzle 30 and the ejection side flow channel are registered accurately in position.

(8) Flexible Cable (FPC) Bonding Step

Figure 1H:
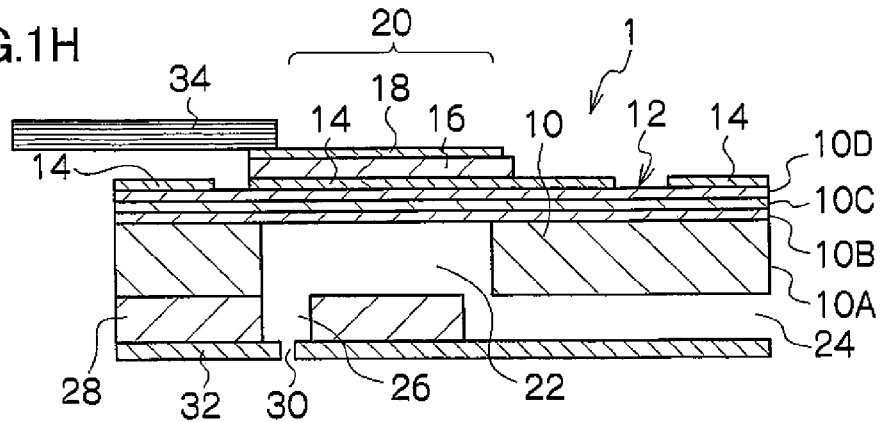

When the structure has been formed by sequentially bonding together the nozzle plate 32, the flow channel plate 28, and the substrate 10 formed with the pressure chamber 22 and the piezoelectric element 20 as shown in FIG. 1G, then a flexible cable (flexible printed circuit (FPC)) 34, which is formed with wiring for the drive voltage to be applied to the piezoelectric element 20, is bonded so as to connect with the upper electrode 18 formed in the step (3), as shown in FIG. 1H. A mode is also possible in which all or a portion of the drive circuitry, such as the switch IC and drive IC, are installed on the FPC 34. Furthermore, a desirable mode is one which uses a connector device to connect the FPC 34.

It is desirable to use a conductive adhesive for bonding the FPC 34. The FPC bonding step is carried out under high-temperature conditions of 130° C. to 150° C.

Figure 2:
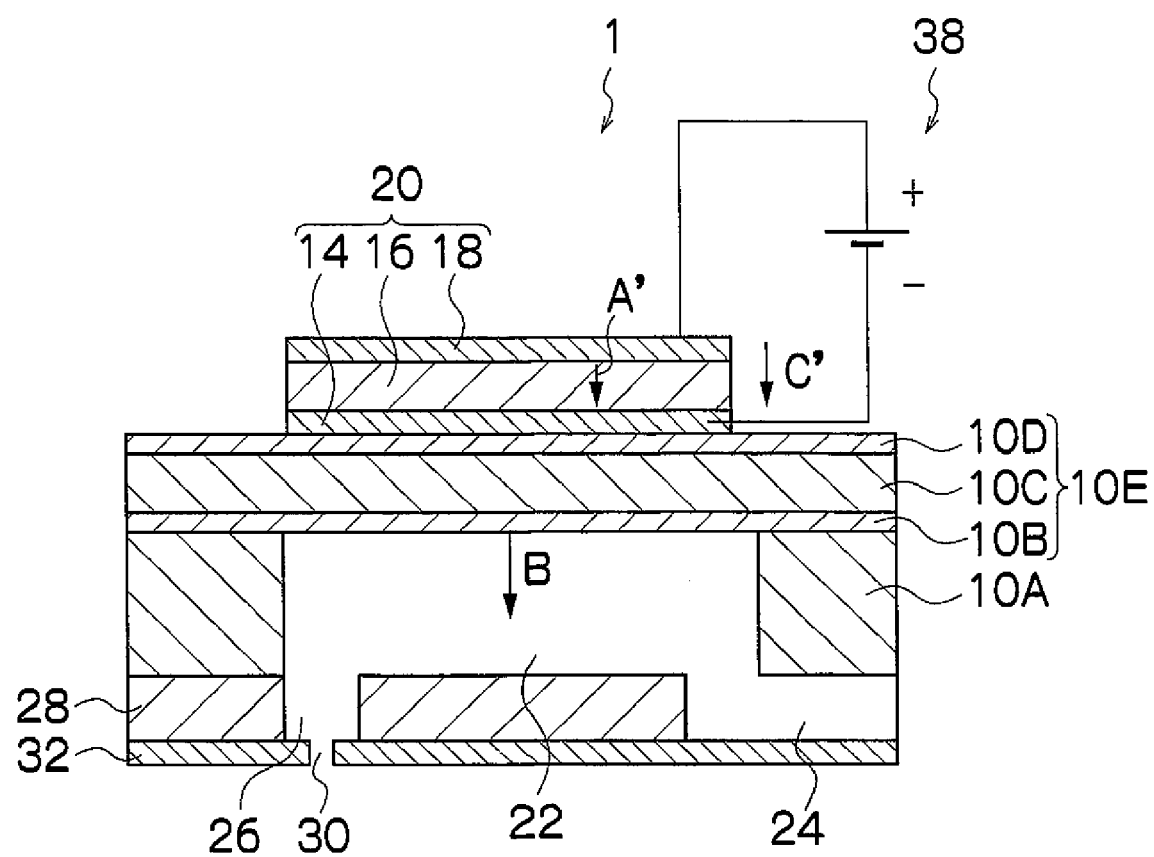
FIG. 2 is a cross-sectional diagram showing the structure of the liquid ejection head manufactured by the process shown in FIGS. 1A to 1H.

FIG. 2 shows the liquid ejection head 1 manufactured through the above-described steps (1) to (8). In FIG. 2, the members corresponding to those in FIGS. 1A to 1H are denoted with the same reference numerals, and explanation thereof is omitted. The FPC 34 shown in FIG. 1H is omitted in FIG. 2.

The liquid ejection head 1 shown in FIG. 2 includes the piezoelectric element 20 having the piezoelectric film 16 epitaxially grown on the lower electrode 14 by sputtering. In the liquid ejection head 1, the upper electrode 18 is used as the address electrode, the lower electrode 14 is used as the ground electrode, and the positive drive voltage is applied to the upper electrode 18 from a drive voltage supply unit 38, and thereby causing the piezoelectric element 20 and the diaphragm 10E to deform so as to reduce the volume of the pressure chamber 22 (to deform in the direction indicated with the arrow B in FIG. 2), so that a droplet is ejected from the nozzle 30.

The polarization direction acquired upon the deposition of the piezoelectric film 16 (piezoelectric element 20) has been reversed, and then the direction of the applied electric field when the lower electrode 14 is used as the ground electrode while the upper electrode 18 is applied with the positive voltage (the direction indicated with an arrow C' in FIG. 2) is now the same with the polarization direction of the piezoelectric element 20 (the direction indicated with the arrow A' in FIG. 2).

Figure 3:
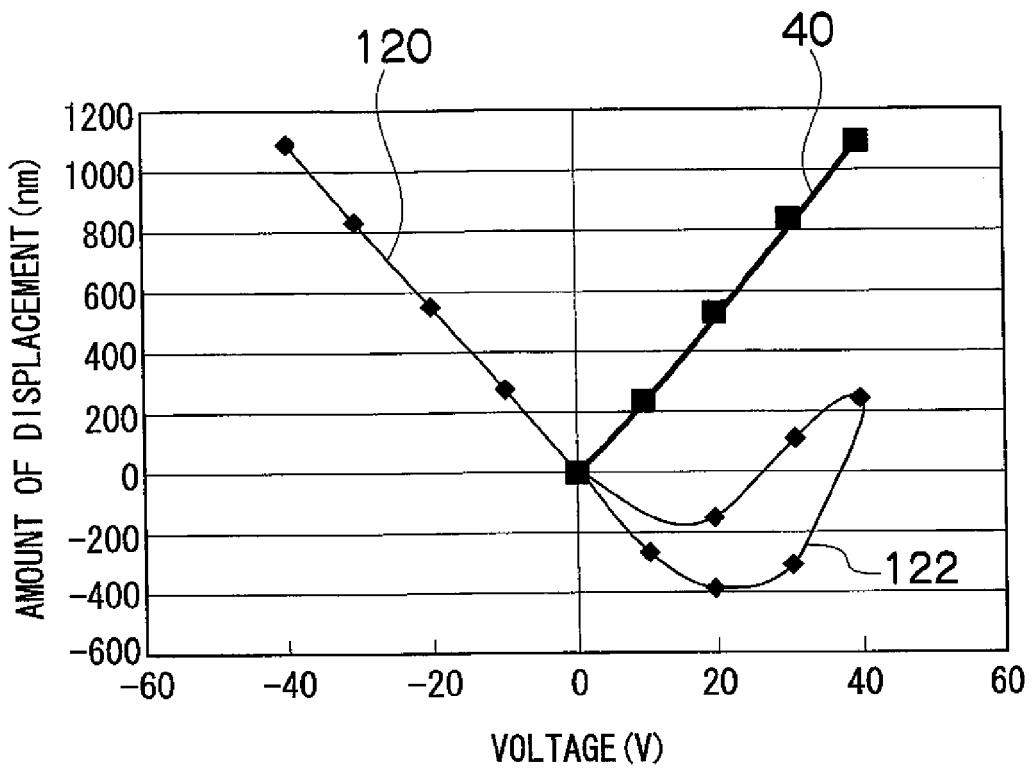
FIG. 3 is a diagram showing a comparison of the characteristics of a piezoelectric element manufactured by the manufacturing process shown in FIGS. 1A to 1H and a piezoelectric element manufactured by a piezoelectric element manufacturing method in the related art.

FIG. 3 is a graph showing the characteristics of the piezoelectric element 20 before the polarization direction reversal processing and the characteristics of the piezoelectric element 20 after the polarization direction reversal processing. The horizontal axis of the graph shown in FIG. 3 represents the voltage (V) applied to the piezoelectric element 20, and the vertical axis of the graph represents the amount of displacement (nanometers) of the piezoelectric element 20. In the following description, the term "electric field" and the term "voltage" may be used interchangeably, unless stated specifically otherwise.

Figure 11:
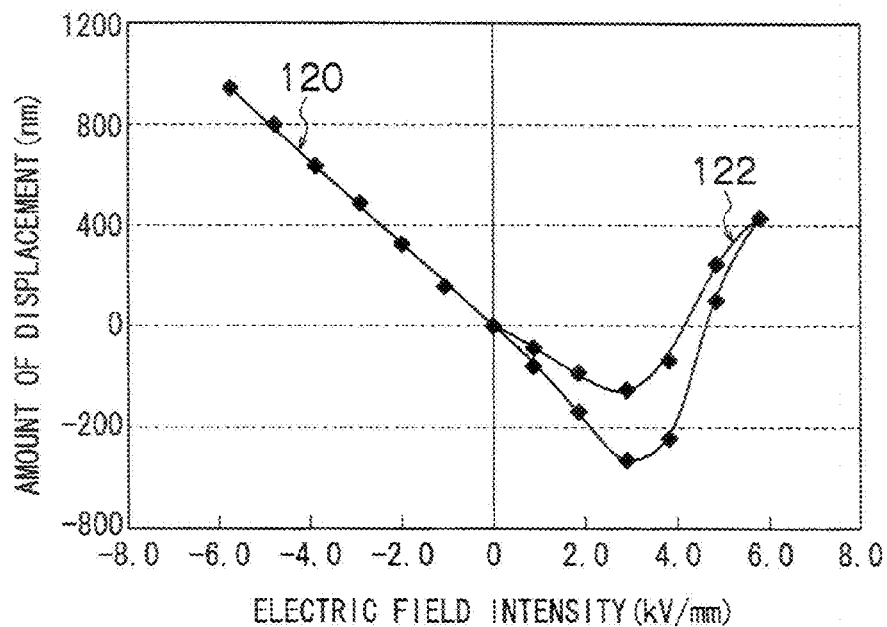
FIG. 11 is a diagram showing the characteristics of the piezoelectric element manufactured by the method according to the related art.
Figure 12:
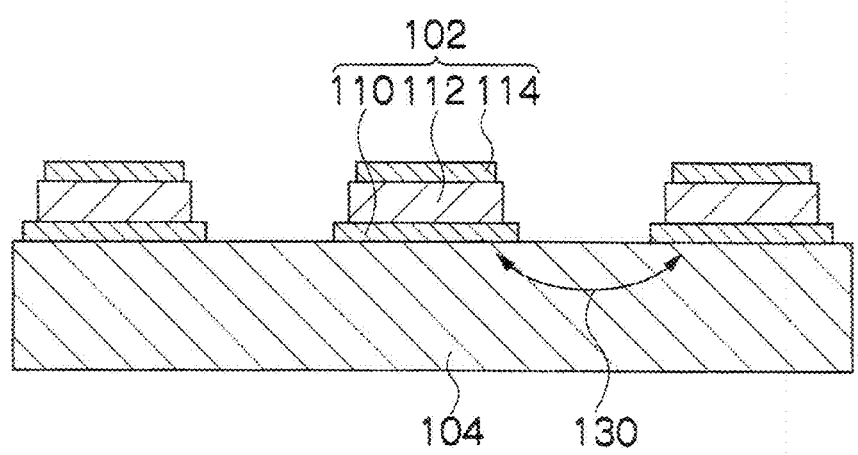
FIG. 12 is a diagram for describing leakage current between the piezoelectric elements in the related art.

The lines 120 and 122 shown in FIG. 3 indicate the characteristics of the piezoelectric element 20 before the polarization direction reversal processing (i.e., the piezoelectric element 102 in the related art described with reference to FIG. 11).

Figure 10:
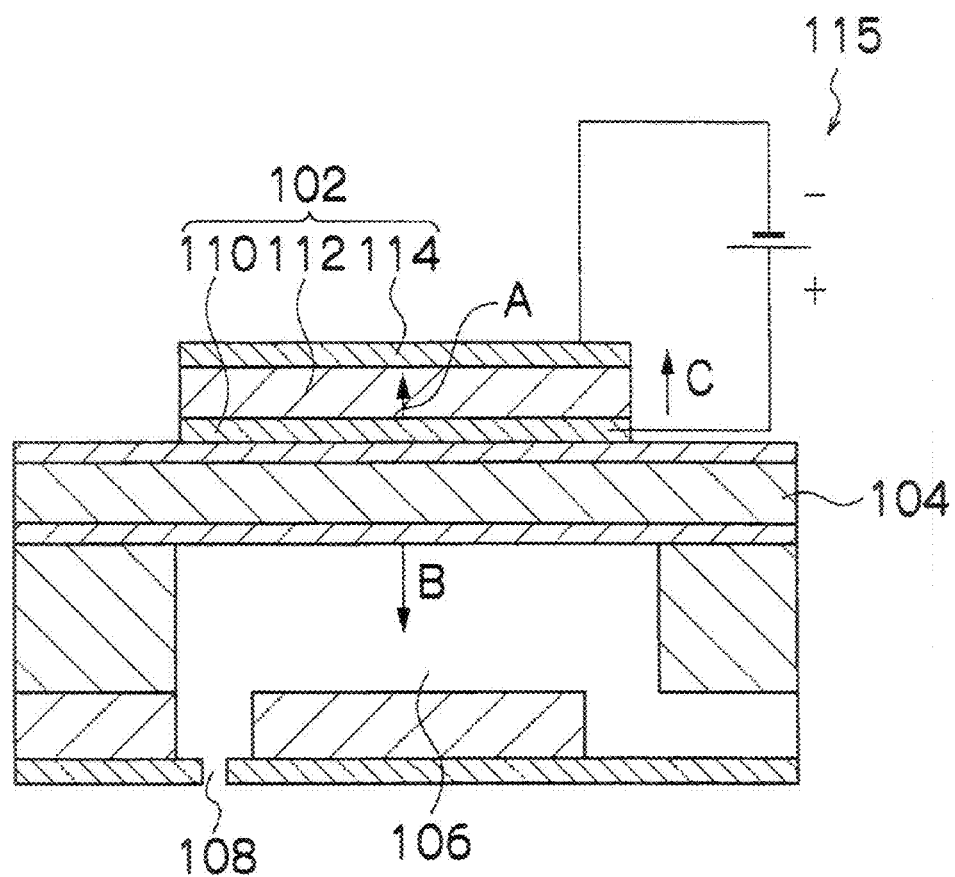
FIG. 10 is a cross-sectional diagram showing the structure of an inkjet head manufactured by a method of manufacturing a liquid ejection head (method of manufacturing a piezoelectric element) according to the related art.

When the lower electrode 14 is used as the ground electrode while the upper electrode 18 is applied with the positive voltage, the direction from the upper electrode 18 toward the lower electrode 14 is taken as a positive direction of the applied electric field (the direction opposite to the direction indicated with the arrow C in FIG. 10). Consequently, the polarization direction of the piezoelectric element 102 (the direction indicated with the arrow A in FIG. 10) is opposite to the positive direction of the applied electric field.

When a voltage in the negative direction (the direction indicated with the arrow C in FIG. 10) is applied to the piezoelectric element 102 (in other words, when the voltage is applied to the piezoelectric element 102 in the same direction as the polarization direction of the piezoelectric element 102), then the piezoelectric element 102 deforms in the direction that causes the ejection of the liquid, and this direction (the direction indicated with the arrow B in FIG. 10) is taken as a positive direction of the displacement of the piezoelectric element 102. The detailed description of the characteristics of the piezoelectric element 20 before the polarization direction reversal processing (i.e., the piezoelectric element 102) has already been given in the description of the related art, and further explanation thereof is omitted here.

On the other hand, the characteristics indicated with a line 40 are the characteristics relating to the applied voltage and the amount of displacement of the piezoelectric element 20 after the polarization direction reversal processing (the piezoelectric element 20 manufactured by the piezoelectric element manufacturing method according to the present embodiment). In the characteristics indicated with the line 40, the lower electrode 14 is used as the ground electrode while the upper electrode 18 is applied with the positive voltage, and in this case, the direction from the upper electrode 18 toward the lower electrode 14 is taken as the positive direction of the applied electric field (the direction indicated with the arrow C' in FIG. 2). Therefore, the polarization direction of the piezoelectric element 20 (the direction indicated with the arrow A' in FIG. 2) is the same with the positive direction of the applied electric field.

When the voltage in the positive direction is applied to the piezoelectric element 20, then the piezoelectric element 20 deforms in the direction that causes the ejection of the liquid (the downward direction in FIG. 2), and this direction (the direction indicated with the arrow B in FIG. 2) is taken as the positive direction of the displacement of the piezoelectric element 20.

As a result of carrying out the polarization direction reversal processing, it is possible to use the characteristics of the portion of the piezoelectric element 20 that has a directly proportional relationship between the applied voltage and the amount of displacement, in order to drive the piezoelectric element 20 to cause the ejection of the liquid. Furthermore, since the peak amount of displacement before the polarization direction reversal processing (i.e., the amount of displacement at the applied voltage of −40V on the line 120), namely 1100 (nm), is the same as the peak amount of displacement after the polarization direction reversal processing (i.e., the amount of displacement at the applied voltage of 40V on the line 40), 1100 (nm), then no deterioration in characteristics is observed as a result of the polarization direction reversal processing.

Figure 4:
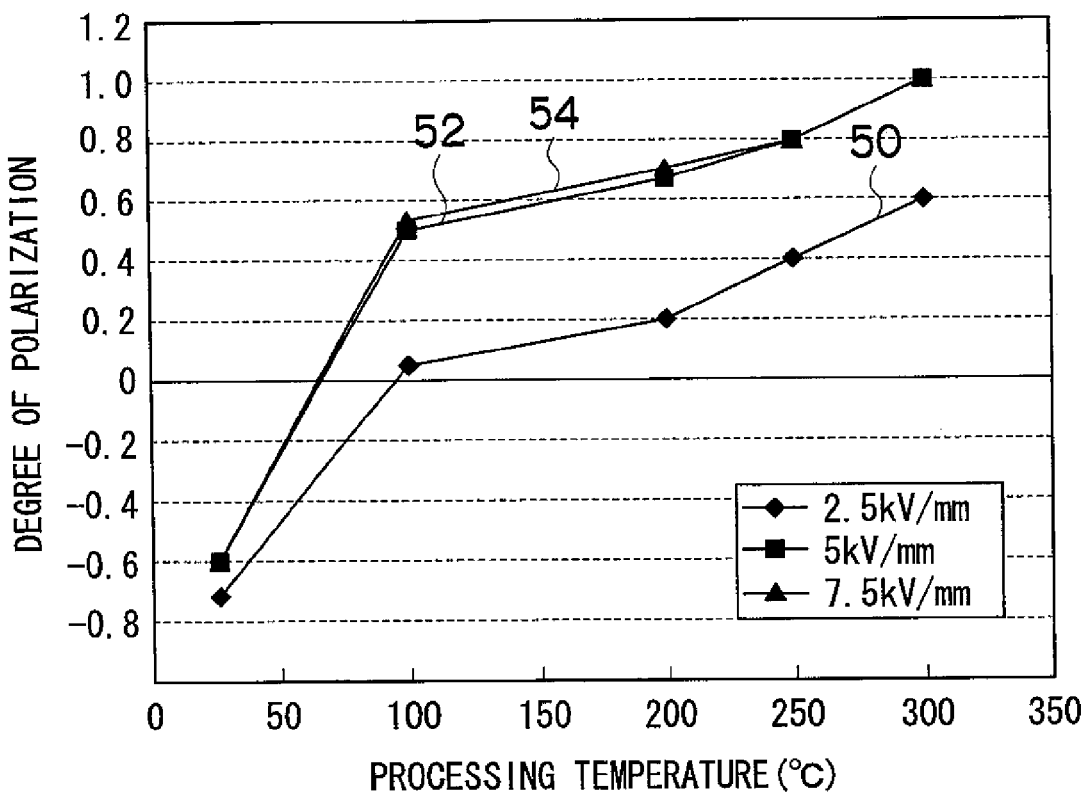
FIG. 4 is a diagram showing the relationship between the polarization reversal processing temperature and the degree of polarization in the polarization reversal processing step shown in FIG. 1D.

FIG. 4 shows the relationship between the applied electric field intensities $E_1$ during the polarization direction reversal processing (hereinafter referred to as the "processing electric field intensity" $E_1$) and the resulting degrees of polarization for the piezoelectric elements having the polarization direction that is reversed from the polarization direction upon the film deposition) having been subjected to the polarization direction reversal processing at different temperatures (the first temperatures $T_1$). More specifically, FIG. 4 shows the differences in the effects of the polarization direction reversal processing resulting from the differences in the environment temperature $T_1$ in the polarization direction reversal processing (hereinafter referred to as the "processing temperature" $T_1$). The horizontal axis in FIG. 4 indicates the processing temperature $T_1$, and the vertical axis in FIG. 4 indicates the degree of polarization, which is expressed by (the amount of displacement after the polarization direction reversal processing)/(the amount of displacement before the polarization direction reversal processing). Then, the degree of polarization is 1.0 if the same amount of displacement is obtained both before the polarization direction reversal processing and after the polarization direction reversal processing when applying a certain electric field (voltage) to the piezoelectric element.

The characteristics lines shown in FIG. 4 are obtained by the following procedure.

A sample piezoelectric element having a thickness of 4 μm is placed on a hot plate, and the temperature of the hot plate is raised to the first temperature $T_1$ (e.g., 300° C.) over 10 minutes (e.g., 30° C./min). Then, the temperature $T_1$ (e.g., 300° C.) is maintained while a direct voltage (e.g., 30V, i.e., the processing electric field intensity $E_1$ of 7.5 kV/mm) is applied to the piezoelectric element for 10 minutes. Then, the application of the electric filed of the intensity $E_1$ to the piezoelectric element is maintained while the temperature of the hot plate is lowered to the second temperature $T_2$ (e.g., 70° C.) over 20 minutes (e.g., 13° C./min), and when the temperature of the hot plate reached the second temperature $T_2$ (e.g., 70° C.), the application of the electric filed of the intensity $E_1$ is stopped and the piezoelectric element is removed from the hot plate.

The amount of displacement before the polarization direction reversal processing is obtained by applying a negative voltage of a certain absolute value to the piezoelectric element before the polarization direction reversal processing, and the amount of displacement after the polarization direction reversal processing is obtained by applying a positive voltage of the same certain absolute value to the piezoelectric element after the polarization direction reversal processing.

In this way, the relationship between the processing temperature (the first temperature) $T_1$ and the degree of polarization shown in FIG. 4 is found, while varying the processing temperature $T_1$ and the processing electric field intensity $E_1$. The processing temperature $T_1$ is set to five different levels: 25° C., 100° C., 200° C., 250° C. and 300° C., and the processing electric field intensity $E_1$ is set to three different levels: 2.5 kV/mm, 5.0 kV/mm and 7.5 kV/mm. The characteristics lines 50, 52 and 54 in FIG. 4 show the characteristics in the cases where the processing electric field intensities $E_1$ are 2.5 kV/mm, 5.0 kV/mm and 7.5 kV/mm, respectively.

As shown in FIG. 4, when the processing temperature $T_1$ is 25° C., the degree of polarization is a negative value, regardless of the processing electric field intensity $E_1$. In other words, the piezoelectric element after the polarization direction reversal processing deforms in the negative direction when applied with the positive voltage. This means that the polarization direction is not reversed when the processing temperature $T_1$ is 25° C.

If the processing electric field intensity $E_1$ is 2.5 kV/mm, then when the processing temperature $T_1$ is 100° C., the degree of polarization assumes a positive value (in other words, the direction of deformation is the same, both before the polarization direction reversal processing and after the polarization direction reversal processing). Moreover, as the processing temperature $T_1$ is progressively raised from 100° C., to 200° C., 250° C. and 300° C., the degree of polarization becomes greater, and at the processing temperature $T_1$ of 300° C., the degree of polarization reaches the maximum value of 0.6.

If the processing electric field intensities $E_1$ are 5.0 kV/mm and 7.5 kV/mm, then virtually the same characteristics are obtained. When the processing temperature $T_1$ is 100° C., the degree of polarization assumes a positive value (in other words, the direction of displacement is the same, before the polarization direction reversal processing and after the polarization direction reversal processing), and as the processing temperature $T_1$ is progressively raised to 200° C., 250° C. and 300° C., the degree of polarization becomes greater. At the processing temperature $T_1$ of 300° C., the degree of polarization becomes the maximum value of 1.0.

Consequently, it is desirable that the processing temperature $T_1$ is not lower than 100° C., and it is more desirable that the processing temperature $T_1$ is set as high as possible. Furthermore, it is desirable that the processing electric field intensity $E_1$ is not lower than 5.0 kV/mm, within a range not exceeding the withstanding electric field intensity of the piezoelectric film.

Figure 5:
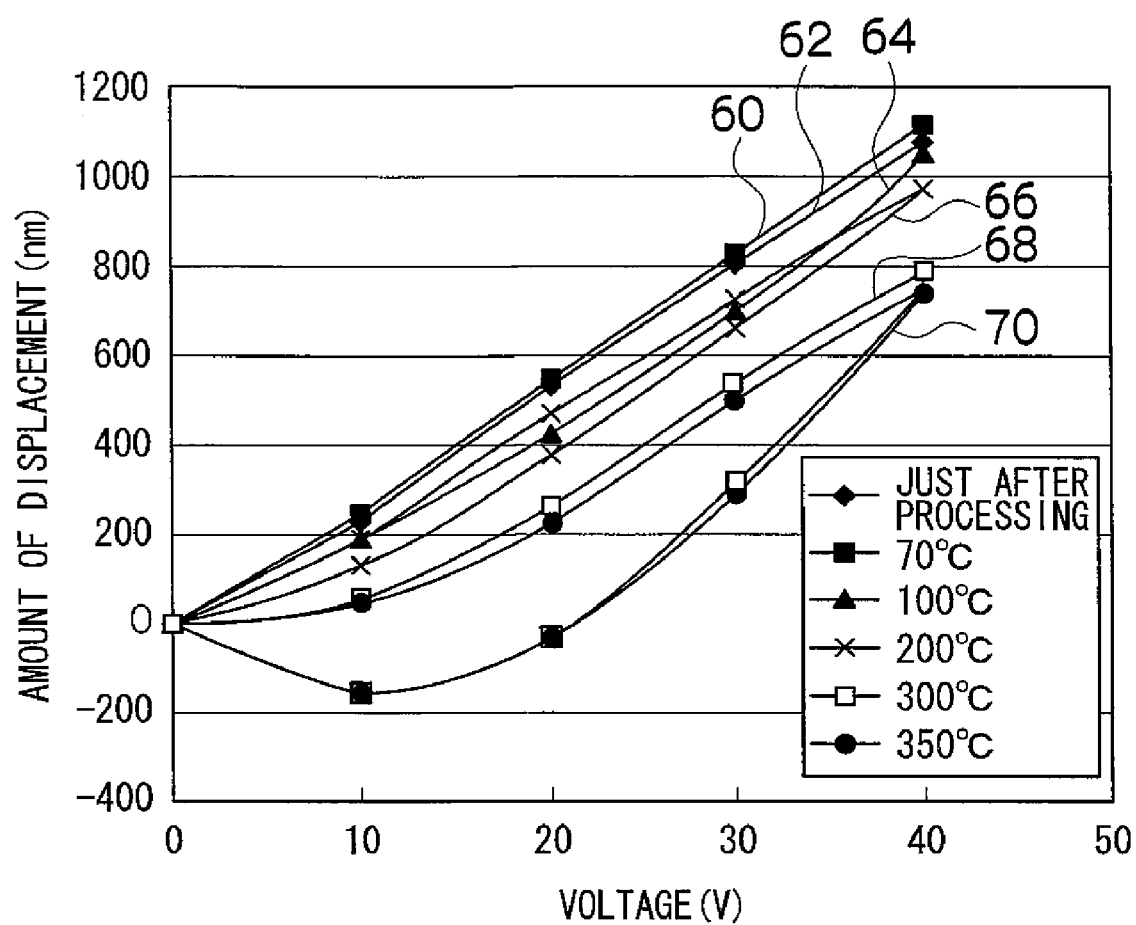
FIG. 5 is a diagram for describing the temperature at which the electric field application for the polarization direction reversal processing is stopped in the step shown in FIG. 1D.

FIG. 5 shows the determination results for the amount of displacement of the piezoelectric element, after carrying out the polarization direction reversal processing under the above-described conditions and then applying a temperature of 70° C. to 350° C. (the second temperature $T_2$) for a period of 15 minutes, which means that the second temperature $T_2$ at which the application of the electric field for the polarization direction reversal processing is stopped is changed.

The horizontal axis in FIG. 5 indicates the applied voltage (V) for deforming the piezoelectric element after the processing electric field application is stopped, and the amounts of displacement are measured at 10V intervals, from 0V to 40V. In FIG. 5, the characteristics just after the polarization direction reversal processing are indicated with a line 60, and the characteristics when the second temperatures $T_2$ are 70° C., 100° C., 200° C., 300° C. (where the processing electric field application is stopped while the temperature is maintained at the processing temperature, without allowing the temperature to fall), and 350° C. (where the processing electric field application is stopped after raising the temperature above the processing temperature) are indicated with lines 62, 64, 66, 68 and 70, respectively.

As shown in FIG. 5, when the processing electric field application is stopped at the temperature of 100° C. or above (if the second temperature $T_2$ is set to 100° C. or above), then deterioration in the polarization of the resulting piezoelectric film is observed, and even if the prescribed voltage is applied to the piezoelectric film, it is not possible to obtain the originally intended displacement. On the other hand, if the processing electric field application is stopped at the temperature of 70° C. or lower, then no deterioration of the polarization of the resulting piezoelectric film is observed, as indicated with the lines 60 and 62 in FIG. 5. Consequently, the temperature at which the processing electric field application is stopped in the polarization direction reversal processing (the second temperature $T_2$) is set to the temperature of 70° C. or lower. Since it is difficult to control the temperature if the second temperature $T_2$ is set below 10° C., then the second temperature $T_2$ is set to the temperature not lower than 10° C.

In the above-described piezoelectric element manufacturing method and liquid ejection head manufacturing method, the oriented piezoelectric film, which has been grown by is epitaxial growth or oriented growth by sputtering or the like, is subjected to the polarization direction reversal processing, in which the first temperature $T_1$ of not lower than 100° C. and lower than the Curie point of the piezoelectric material of the piezoelectric film is maintained while the electric field of the intensity $E_1$ is applied to the piezoelectric film in the direction opposite to the orientation direction of the piezoelectric film, the first temperature $T_1$ and the application of the electric field of the intensity $E_1$ are maintained for a prescribed period of time, whereupon the application of the electric field of the intensity $E_1$ is maintained while lowering the temperature to the second temperature $T_2$ of 70° C. or lower, and then the application of the electric field of the intensity $E_1$ is stopped. Thus, it is possible to control the amount of displacement and the direction of displacement of the oriented piezoelectric film.

If the piezoelectric film is formed by depositing the piezoelectric material on the lower electrode by sputtering, the piezoelectric film has the polarization in the direction from the lower electrode toward the upper electrode, at the time of the deposition. Then, the piezoelectric element including the piezoelectric film is subjected to the polarization direction reversal processing, by which the polarization direction of the piezoelectric film is reversed. Thus, it is possible that the piezoelectric element after the polarization direction reversal processing is caused to deform in the liquid ejection direction by setting the lower electrode as the reference potential (ground) while applying a positive voltage to the upper electrode. Moreover, it is possible to control satisfactorily the amount of displacement of the piezoelectric element.

The present invention displays particularly beneficial effects in a head having a plurality of nozzles and piezoelectric elements. Here, FIGS. 6A to 6C show embodiments of the heads having a plurality of nozzles.

The head 1 shown in FIG. 6A is a full-line type of head having a length corresponding to the maximum width of a medium that receives the ejected liquid, wherein a plurality of nozzles 30 are arranged through a length exceeding at least a side of the medium of maximum size (the full width of the range that receives the ejected liquid), on the nozzle surface of the head.

FIG. 6B is an enlarged view of a portion of FIG. 6A, and FIG. 6C is a perspective plan diagram showing another embodiment of the structure of the head 1. As shown in FIGS. 6A and 6B, the head 1 according to the present embodiment has a structure in which a plurality of ink chamber units 25, each including the nozzle 30 forming a liquid ejection hole, a pressure chamber 22 corresponding to the nozzle 30, and a supply port 23, and the like, are disposed two-dimensionally in the form of a staggered matrix, and hence the effective nozzle interval (the projected nozzle pitch) as projected in the lengthwise direction of the head (the sub-scanning direction perpendicular to the conveyance direction of the ejection receiving medium) is reduced and high nozzle density is achieved.

The mode of forming one or more nozzle rows through the length corresponding to the entire width of the ejection receiving medium in the direction substantially perpendicular to the conveyance direction of the ejection receiving medium is not limited to the described above embodiment. For example, instead of the configuration in FIG. 6A, as shown in FIG. 6C, a line head having nozzle rows of the length corresponding to the entire width of the ejection receiving medium can be formed by arranging and combining, in a staggered matrix, short head blocks 1' having a plurality of nozzles 30 arrayed in a two-dimensional fashion. Furthermore, although not shown in the drawings, it is also possible to compose a line head by arranging heads of short dimensions in one row.

When implementing the present invention, the structure of nozzle arrangement is not limited to those in the embodiments shown in the drawings, and various other structures of nozzle arrangement (e.g., arrangement having one nozzle row in the sub-scanning direction) can be adopted.

Furthermore, the scope of application of the present invention is not limited to an ejection method based on a line head, and it is also possible to employ a serial method in which liquid ejection is carried out in the breadthways direction of the recording medium while scanning the recording medium with a short head which is shorter than the breadthways length of the recording medium in the breadthways direction of the recording medium, and when one operation of liquid ejection in the breadthways direction has been completed, the recording medium is moved by a prescribed amount in a direction perpendicular to the breadthways direction, and liquid ejection is carried out in the breadthways direction of the recording medium on the next ejection region, this operation being repeated in such a manner that liquid ejection is carried out over the full surface of the liquid receiving region of the ejection medium.

Second Embodiment

Next, a method of manufacturing a piezoelectric element and a method of manufacturing a liquid ejection head according to the second embodiment of the present invention are described.

In the manufacturing process for the head described with reference to FIGS. 1A to 1H, etching is used in the piezoelectric element patterning step (5), and in this etching step, the piezoelectric element 20 may locally reach a high temperature of 150° C. or above. Furthermore, the FPC bonding step (8) may be carried out in high-temperature conditions of 130° C. to 150° C.

In other words, the steps following the polarization direction reversal processing step (4) may include processes that are carried out in a high-temperature environment of 130° C. to 350° C. Due to the processes that are carried out at temperatures between 130° C. to 350° C. after the polarization direction reversal processing, there is a problem of decline in the degree of polarization of the piezoelectric element 20.

In the piezoelectric element manufacturing method of the present embodiment, a repolarization step is carried out after the FPC bonding step (8). More specifically, the final product after the FPC bonding step (the head 1 after the FPC bonding step) includes the components that cannot be exposed to high temperatures, such as the switch IC, and therefore the repolarization step mentioned above is carried out by applying the electric field of the same intensity as that in the polarization direction reversal processing step and in the same direction as the polarization direction after the polarization direction reversal processing, in a normal temperature environment (for example, 10° C. to 50° C.). Similarly to the polarization direction reversal processing step, the application time of the electric field in the repolarization step is one minute or more, and desirably, a duration not shorter than 10 minutes and shorter than 60 minutes.

Figure 7:
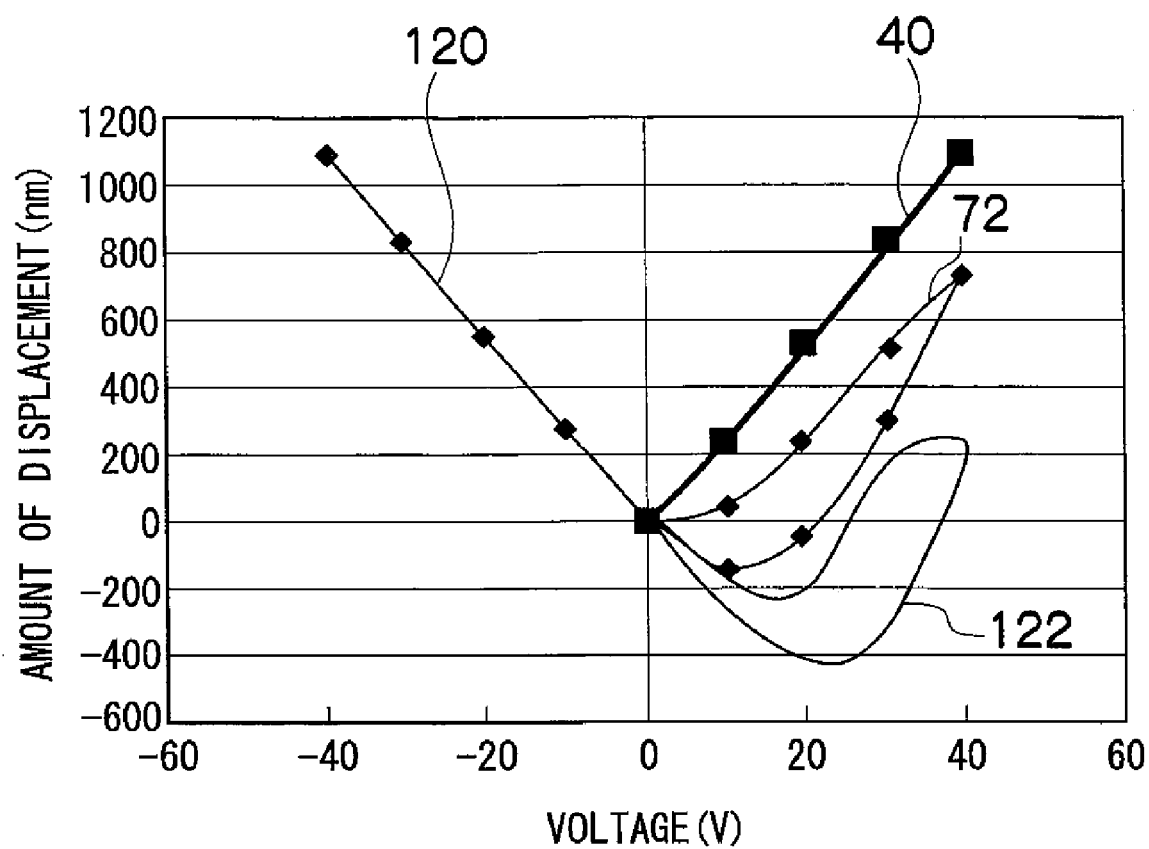
FIG. 7 is a diagram showing the characteristics of a piezoelectric element manufactured by a method of manufacturing a liquid ejection head (method of manufacturing the piezoelectric element) according to a second embodiment of the present invention.

The characteristics indicated with the line 40 in FIG. 7 are the characteristics of the piezoelectric film (piezoelectric element) after the polarization direction reversal processing as described above with reference to FIG. 3. When the piezoelectric element having these characteristics is heated to 400° C. (a temperature higher than the Curie point of the piezoelectric material of the piezoelectric element) for example, then the piezoelectric element assumes the characteristics indicated with a line 72 in FIG. 7, and deterioration of performance is observed in terms of reduction in the amount of displacement.

The characteristics indicated with the line 72 show decline in the amount of displacement in the applied voltage range of 0V to 40V, with respect to the characteristics in the case indicated with the line 40 where the heating is not carried out, and furthermore, a phenomenon of reverse in the direction of displacement is observed in the applied voltage range of 0V to 10V. By carrying out the repolarization processing at room temperature, with respect to the piezoelectric element that has the characteristics indicated with the line 72 in FIG. 7, the piezoelectric element can be restored to have the characteristics indicated with the line 40.

It was discovered that the oriented piezoelectric element that has undergone the polarization direction reversal processing once at a high temperature, becomes more liable to undergo the polarization processing after having been heated to a temperature higher than the Curie point of the piezoelectric material of the piezoelectric element (in other words, the repolarization can be performed easily after the polarization direction reversal processing). This phenomenon is not observed in a normal bulk piezoelectric body.

The reason why this phenomenon occurs is thought to be because a stress is exerted on the piezoelectric element when it returns to normal temperature after the polarization direction reversal processing, and this stress prevents further reversal of the polarization direction of the piezoelectric element that has already undergone the polarization direction reversal processing.

According to the second embodiment of the present invention, the oriented piezoelectric film that has been exposed to the temperature of 100° C. or above after the polarization direction reversal processing described in the first embodiment is subjected to the repolarization processing by applying the electric field in the direction opposite to the polarization direction upon the deposition, at a temperature (for example, normal temperature) lower than the temperature during the polarization direction reversal processing. Thereby, it is possible to control the amount of displacement and the direction of displacement of the piezoelectric element, even if the piezoelectric film is subjected to the high-temperature process during its manufacture (the manufacturing process for a head equipped with a piezoelectric element including the piezoelectric film) (in other words, even if the piezoelectric film undergoes processing that is carried out in a high-temperature environment).

In other words, by carrying out the repolarization processing at normal temperature, on the piezoelectric element that has suffered degradation of characteristics due to high-temperature processing carried out after the polarization direction reversal processing, the piezoelectric element can be restored.

Third Embodiment

Next, a third embodiment of the present invention is described.

In the manufacturing process for the head shown in FIGS. 1A to 1H, the final product includes the components that should not be exposed to high temperatures, such as the switch IC, or material that cannot be exposed to high temperatures, such as adhesive, and therefore, due to processing restrictions, it is difficult to carry out the polarization direction reversal processing by applying a high temperature. Furthermore, even if a high temperature can be applied, it is not possible to apply a high voltage that exceeds the withstanding voltage of the components. Then, instead of the polarization direction reversal processing that is carried out using a high-voltage in a high-temperature environment as described in the first and second embodiments, an alternating electric field application step of applying an alternating electric field having an intensity equal to or higher than the coercive electric field of the piezoelectric element is carried out, whereby it is possible to achieve the polarization direction reversal processing under normal temperature conditions, as well as being able to achieve the polarization direction reversal processing using a low voltage, in a range not exceeding the withstanding voltage of the switch IC, and the like. Consequently, it is possible to carry out the polarization direction reversal processing (and polarization processing) on the final product (in a state where the FPC and switch IC have been installed).

More specifically, an alternating electric field equal to or higher than the coercive electric field of the piezoelectric element 20 is applied between the upper electrode 18 and the lower electrode 14 (alternating electric field application step), in the head 1 shown in FIG. 1H (after the FPC bonding step (8)), whereupon a direct electric field of intensity not lower than 1 kV/mm and not higher than 10 kV/mm is applied in the direction from the upper electrode 18 toward the lower electrode 14 (polarization direction reversal processing step) under a predetermined temperature environment (for example, 10° C. to 70° C.).

Figure 8A:
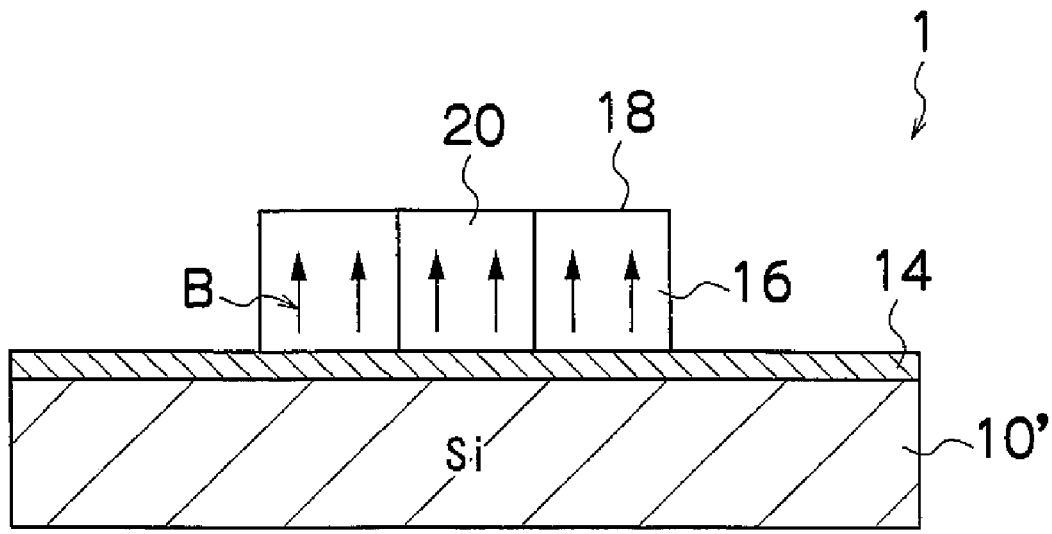
FIGS. 8A and 8B are diagrams describing the coercive electric field.
Figure 8B:
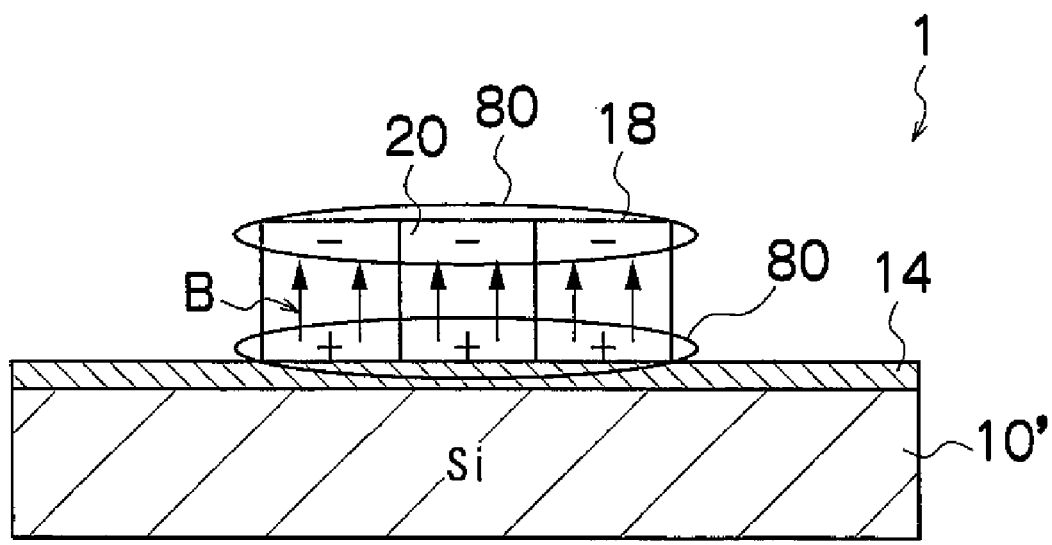

Next, the mechanism leading to the reversal of the polarization direction in the piezoelectric element 20 is described. FIGS. 8A and 8B show schematic drawings of the piezoelectric element 20 mounted on the head 1 (substrate 10'). FIG. 8A shows the piezoelectric element 20 immediately after the deposition of the piezoelectric film, and the direction indicated by the arrow B is the polarization direction. One reason why it is difficult to reverse the polarization direction after the deposition of the piezoelectric film is the constraint of spontaneous polarization caused by the spatial charge. More specifically, as shown in FIG. 8B, the spatial electric field 80 fixes the polarization direction at the deposition of the piezoelectric element 20, and thus makes it difficult to reverse the polarization direction.

In the present embodiment, the spatial charge is removed by applying the alternating electric field equal to or higher than the coercive electric field, to the piezoelectric element 20, and hence reversal of the polarization direction can occur more readily. The coercive electric field of the piezoelectric body is the intensity of the electric field that is capable of changing the polarization of the piezoelectric body, and in the hysteresis curve for the piezoelectric body, taking the horizontal axis to represent the electric field intensity and taking the vertical axis to represent the polarization, then the coercive electric field is indicated by the point where the hysteresis curve crosses the horizontal axis.

To give one concrete example of the alternating electric field, a sinusoidal alternating voltage of 1 MHz and 40V is applied for one hour to the piezoelectric element 20 including the piezoelectric film 16 having the thickness of 4 μm (i.e., the alternating electric field of 10 kV/mm). The waveform and the application time can be changed appropriately.

In FIG. 9, the characteristics indicated with curve 90 shown by solid lines represent the hysteresis characteristics of the piezoelectric film 16 immediately after the deposition. If the alternating electric field equal to or higher than the coercive electric field described in the present embodiment is applied to the piezoelectric film 16 (piezoelectric element 20) having these characteristics, then the piezoelectric film 16 acquires the characteristics indicated with curve 92 shown by broken lines in FIG. 9. The horizontal axis in FIG. 9 represents the electric field intensity (kV/mm) and the vertical axis represents the polarization (μC/cm$^2$).

As shown in FIG. 9, it can be seen that the coercive electric field lowers after applying the alternating electric field equal to or higher than the coercive electric field of the piezoelectric film 16 immediately after the deposition. This means that the electric field intensity at which the polarization direction is reversed becomes lower, and therefore reversal of the polarization direction can be achieved more readily. Even if the alternating electric field equal to or higher than the coercive electric field is applied, there is no change in the saturation polarization Pm and the remnant polarization Pr. Hence, it is possible to carry out the polarization direction reversal processing without using a high voltage and without requiring a high-temperature environment, and therefore the polarization processing can be carried out on the head 1 shown in FIG. 1H (the final product).

In the first to third embodiments described above, the mode is described in which the piezoelectric film 16 is deposited by sputtering; however, it is also possible to employ another technique, such as sol gelation, CVD, or the like, in order to deposit the piezoelectric film 16.

Furthermore, silicon and magnesium oxide are given as examples of the material of the substrate of the piezoelectric element 20; however, it is also possible to use a material such as stainless steel.

The present embodiments are described with a single-layer piezoelectric element, which has one layer of the piezoelectric film; however, the present invention can also be applied to a multiple-layer piezoelectric element, in which a plurality of piezoelectric films and a plurality of electrodes are layered together alternately.

The method of manufacturing the inkjet head, which ejects ink from the nozzles, is described as an example of the application of the present invention. However, the present invention can be applied widely to a method of manufacturing a piezoelectric element, which functions as a pressure generating element in a liquid ejection head, and to a method of manufacturing a liquid ejection head including the piezoelectric element.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a piezoelectric element, comprising:
   a lower electrode forming step of forming a lower electrode on a surface of a substrate;
   a piezoelectric film deposition step of depositing a piezoelectric film made of a piezoelectric material by one of epitaxial growth and oriented growth onto a surface of the lower electrode reverse to a surface of the lower electrode that is adjacent to the substrate;
   an upper electrode forming step of forming an upper electrode onto a surface of the piezoelectric film reverse to a surface of the piezoelectric film that is adjacent to the lower electrode;
   a polarization direction reversal step of reversing a polarization direction of the piezoelectric film by maintaining, after the upper electrode forming step, a state for a prescribed duration where a temperature of the piezoelectric film is set to a first temperature while application of an electric field to the piezoelectric film in a direction from the upper electrode toward the lower electrode is performed, then keeping the application of the electric field while lowering the temperature of the piezoelectric film to a second temperature lower than the first temperature, and then stopping the application of the electric field;
   a wiring member bonding step of, after the polarization direction reversal step, bonding a wiring member to the upper electrode under a condition where the piezoelectric film is exposed to a third temperature not lower than 130° C. and not higher than 150° C., the wiring member having a wiring pattern to be connected to an external device; and
   a repolarization step of, immediately after the wiring member bonding step, carrying out repolarization processing by applying an electric field to the piezoelectric film in a direction from the upper electrode toward the lower electrode at normal temperature.

2. The method as defined in claim 1, wherein:
   the first temperature is not lower than 100° C. and lower than a Curie point of the piezoelectric material;
   the prescribed duration is not shorter than one minute; and
   the second temperature is not lower than 10° C. and not higher than 70° C.

3. The method as defined in claim 1, wherein the electric field applied in the polarization direction reversal step has an intensity not lower than 5.0 kV/mm.

4. The method as defined in claim 1, wherein the piezoelectric film deposition step is performed with at least one of sputtering, chemical vapor deposition, and sol gelation.

5. The method as defined in claim 1, wherein:
   the wiring member bonded in the wiring member bonding step is a flexible printed circuit including an integrated circuit to be used to drive the piezoelectric element; and
   the electric field applied in the repolarization step has an intensity so as not to apply a voltage exceeding a withstanding voltage of the component to the component.

6. The method as defined in claim 1, wherein the repolarization step includes applying the electric field to the piezoelectric film in the direction from the upper electrode toward the lower electrode at a temperature of 10° C. to 50° C.

7. A method of manufacturing a liquid ejection head including an ejection port from which liquid is ejected, an ejection side flow channel which is connected to the ejection port, a pressure chamber which is connected to the ejection side flow channel and accommodates the liquid to be ejected from the ejection port, and a piezoelectric element which pressurizes the liquid accommodated in the pressure chamber, the method comprising:

a piezoelectric element manufacturing step of manufacturing the piezoelectric element by the method as defined in claim 1;

a pressure chamber forming step of forming the pressure chamber on a surface of the substrate reverse to the surface of the substrate on which the lower electrode is formed;

a flow channel plate bonding step of bonding a flow channel plate formed with the ejection side flow channel to the substrate in which the pressure chamber is formed, after registering the ejection side flow channel and the pressure chamber mutually in position; and an ejection port plate bonding step of bonding an ejection port plate formed with the ejection port to the flow channel plate, after registering the ejection port and the ejection side flow channel mutually in position.

8. The method as defined in claim 7, wherein the piezoelectric element deforms the pressure chamber when a drive voltage is applied to the piezoelectric element through the wiring member.

9. The method as defined in claim 7, wherein:

the wiring member bonded in the wiring member bonding step is a flexible printed circuit including an integrated circuit to be used to drive the piezoelectric element; and the electric field applied in the repolarization step has an intensity so as not to apply a voltage exceeding a withstanding voltage of the component to the component.

\* \* \* \* \*